United States Patent [19]
Makita

[11] Patent Number: 4,579,453
[45] Date of Patent: Apr. 1, 1986

[54] METHOD AND APPARATUS FOR DETECTING A MARK POSITION

[75] Inventor: Yoshinori Makita, Yokohama, Japan

[73] Assignee: Canon Kabushiki Kaisha, Tokyo, Japan

[21] Appl. No.: 536,331

[22] Filed: Sep. 27, 1983

[30] Foreign Application Priority Data

Oct. 2, 1982 [JP] Japan .................... 57-173673

[51] Int. Cl.$^4$ .................................. G01B 11/14
[52] U.S. Cl. ........................... 356/375; 250/548; 356/401
[58] Field of Search ............ 356/375, 399, 400, 401; 250/548

[56] References Cited

U.S. PATENT DOCUMENTS 4,266,876  5/1981  Nakazawa et al. ............ 356/400
4,301,363  11/1981  Suzuki et al. .................. 250/548 X Primary Examiner—F. L. Evans
Attorney, Agent, or Firm—Fitzpatrick, Cella, Harper & Scinto

[57] ABSTRACT

A method of aligning a mask and a wafer for manufacturing semiconductor integrated circuits. The mask and wafer have respective alignment marks which are scanned by a laser beam to detect the misalignment therebetween. The relative position between the mask and wafer is changed in response to the detected misalignment. The marks are formed by bar-like mark elements. The width of the mark element, measured along the line of the beam scan, is 2 to 3 times the diameter of the scanning beam so that the light scattered by the leading edge of the mark element and the trailing edge of the mark element is separately detected by a photoelectric transducer, which produces a first signal in response to the leading edge and a second signal in response to the trailing edge. The position of the mark element is determined on the basis of the falling portion of the first signal and the rising portion of the second signal.

3 Claims, 15 Drawing Figures

FIG. I(a)
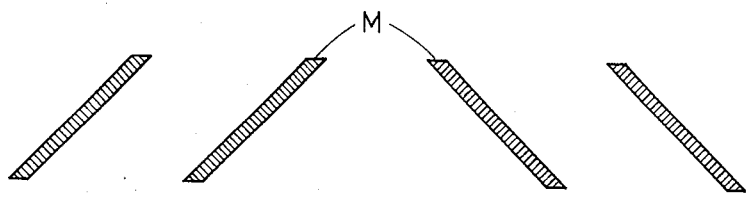
FIG. I(b)
FIG. I(c)
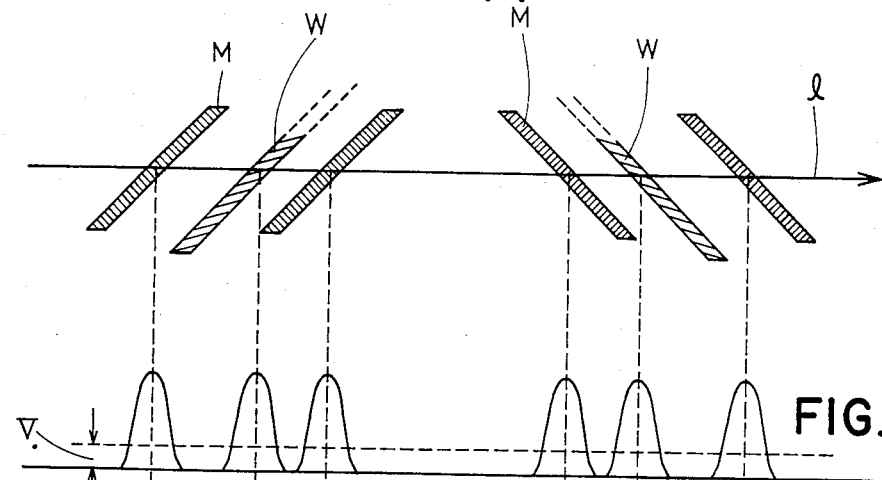
FIG. I(d)
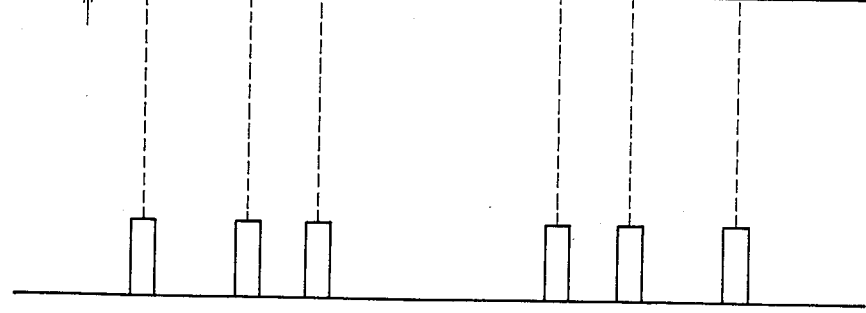
FIG. I(e)

FIG. 3(a)
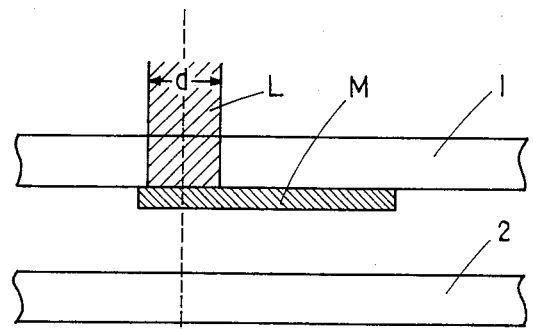
FIG. 3(b)
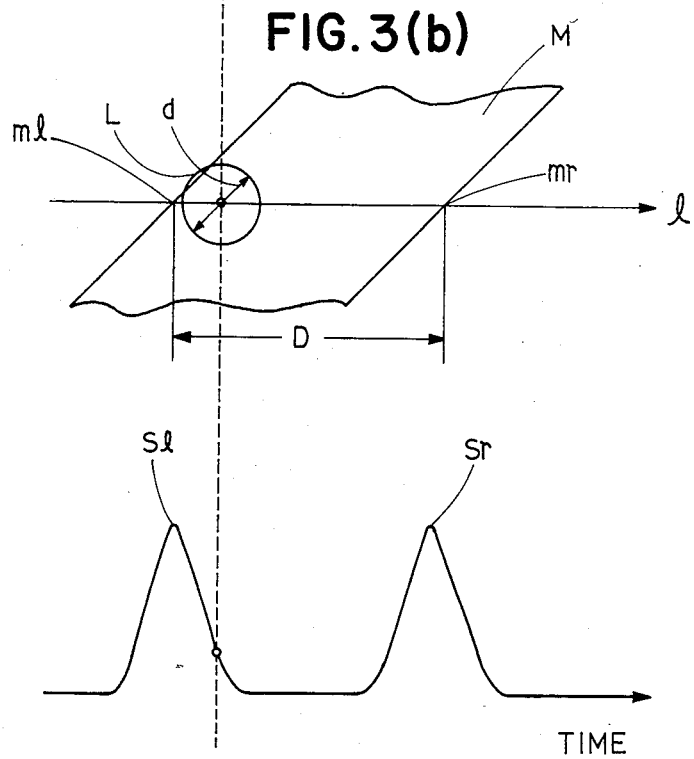
FIG. 3(c)

4,579,453

METHOD AND APPARATUS FOR DETECTING A MARK POSITION

BACKGROUND OF THE INVENTION

1. Field of the Invention

The present invention relates to a method and apparatus for detecting a mark position wherein a mark is scanned by a beam, such as a laser beam, and the beam reflected by the mark is used to detect the position of the mark.

2. Description of the Prior Art

As an example of apparatus wherein a position of a mark is detected, an exposure and alignment apparatus for manufacturing integrated circuits contains a laser beam scanner which scans the alignment marks preformed on the mask and wafer, and the light scattered and diffracted by edges of the marks is used for detecting the mark positions so as to provide signals for alignment between the wafer and mask. More particularly, the light specularly reflected by the mask and wafer is removed, and only the scattered and diffracted light is received by a photoelectric transducer which produces an electric pulse signal in response to the quantity of the scattered and diffracted light. Then, the intervals between the pulses are measured by a clock pulse counter or the like to determine the position of the mark.

FIG. 1 shows the principle of the detection of the mark positions in such prior art, wherein the mask has such an alignment mark M as shown in FIG. 1(a), while the wafer has such an alignment mark W as shown in FIG. 1(b). Those marks are overlaid as shown in FIG. 1(c). Then, a laser beam having a relatively large diameter in cross-section scans the alignment marks M and W along a scanning line l, so that a photoelectric transducer receiving the light reflected by the marks produces the pulse signals as shown in FIG. 1(d). The signals are cut at a suitable threshold voltage V with the use of a comparator, whereby a series of rectangular pulse signals are obtained. The spacings or intervals between the adjacent marks are calculated from the series of pulses so that the relative position between the alignment marks M and W is discriminated. The relative position between the mask and wafer is changed in response to the discrimination indicative of the amount of misalignment, by suitable means to bring them into alignment.

However, the inventor has found that, in this system, the relation between the actual mark position and the position where the pulse signal is generated is not constant but varies for each of the scans, so that the correct position detection is difficult.

SUMMARY OF THE INVENTION

It is an object of the present invention to provide a method and apparatus for more accurate detection of the position of a mark.

It is another object of the present invention to provide a method and apparatus for accurate detection of a mark position with relatively simple structures.

It is a further object of the present invention to provide a method of accurate detection of a mark position with the use of a laser beam having a small diameter cross-section.

These and other objects, features and advantages of the present invention will become more apparent upon a consideration of the following description of the preferred embodiment of the present invention taken in conjunction with the accompanying drawings.

BRIEF DESCRIPTION OF THE DRAWINGS

FIGS. 1(a-e) illustrated a prior art method of detecting a mark position;

FIGS. 3(a-c) illustrate the scanning method according to the present invention;

DESCRIPTION OF THE PREFERRED EMBODIMENTS

Figure 2A:
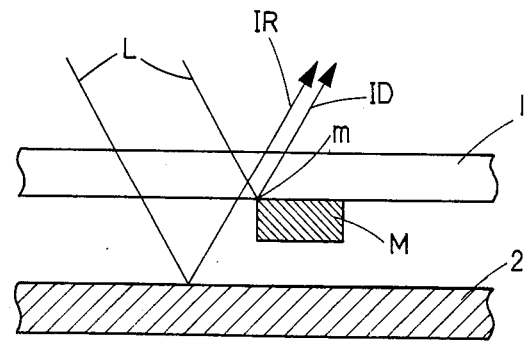
FIGS. 2(a) and (b) illustrate the states of light reflection around a mark edge when a small diameter laser beam is used.
Figure 2B:
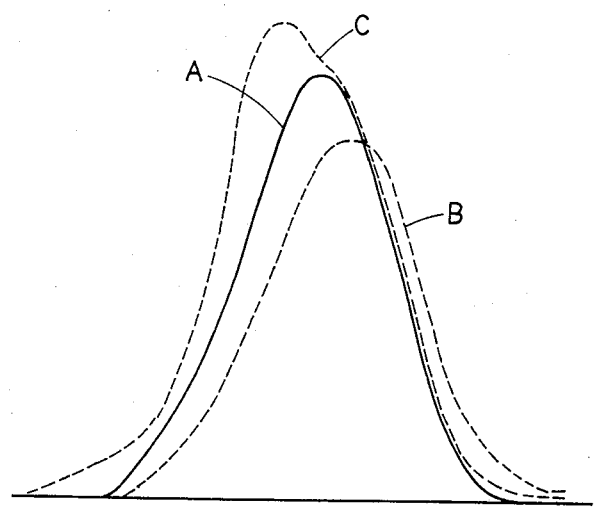

Referring now to FIG. 2, wherein a very fine laser beam L illuminates the edge of the alignment pattern or mark M on a mask 1, the problems with the detection utilizing the fine laser beam will first be described before the present invention is explained. The laser beam L is reflected by the edge m of the alignment mark M of the mask 1 as scattered and diffracted light ID, and is reflected by the wafer 2 surface as reflected light IR, as shown in FIG. 2(a), which shows a cross-section along the scanning line. FIG. 2(b) shows the signal obtained from such light, wherein reference character A depicts the component of the signal only from the scattered and diffracted light ID, and reference characters B and C depict the signals from the light influenced by and interfered with the light reflected by the wafer 2 surface. The intensity of the scattered and diffracted light exhibits the normal or Gaussian distribution with its center corresponding to the edge m of the mark, but the distribution is deformed by the interference with the light reflected by the wafer 2 surface. The degree and direction of the deformation irregularly varies for individual scans as shown by the curves B and C. It has been formed, however, that the degree of the variation is large at the outside of the mark M, i.e., the rising portion of the signal, the lefthand side, as viewed in FIG. 2(b). Such unstable variations are inherently involved in the scattered and diffracted light, irrespective of the diameter of the beam. When the scattered and diffracted light, which is influenced by the light reflected by the wafer 2 is used, as it is, for detecting the edge position of the mark, an error in detection is not avoidable.

To solve the problem, in a reflection projection optical system or refraction projection optical system, it is possible to use a phase plate or the like, thus providing a phase difference between the scattered and diffracted light and the light reflected by the wafer 2 so as to remove the above-described influence, to the scattered and diffracted light, of the wafer-reflected light. The accuracy of the alignment will be increased by this. However, in a contact type apparatus or the like wherein the mask 1 and wafer 2 are almost in contact with each other, it is not practically possible to dispose such an optical element to prevent the interference, so that it would be substantially impossible to avoid the interference with the wafer-reflected light.

FIG. 3 illustrates the principle of alignment mark detection according to an embodiment of the present invention. The topmost part of FIG. 3 designated by (a), shows a cross-section of the mask 1 having an alignment mark M and wafer 2 taken along a scanning line. The mask 1 is above the wafer 2 in the proximity thereof. FIG. 3 further shows at (b) the plan view of a part of the bar-like mark M, corresponding to FIG. 3(a). The laser beam L having a diameter d scans the mark M along the scanning line l. The width of the mark M, measured along the scanning line l, is approximately 2d to 3d. FIG. 3(c) shows output signals Sl and Sr which is obtained as a result of a scan by the laser beam L, wherein the signals Sl and Sr correspond to the lefthand side edge ml of and mark M and righthand edge mr thereof, respectively. Those signals of the form as shown are generated by the light scattered by the edges ml and mr of the mark M, when the laser beam L scans the bar of the mark M. The affect to the scattered light by the interference with the light IR reflected by the wafer 2 as explained hereinbefore, exists more at the outside parts of the signals Sl and Sr, i.e., the rising part of the signal Sl and the falling part of the signal Sr. However, the falling part of the signal Sl and the rising part of the signal Sr are not influenced much by the interference since the light Ir reflected by the wafer is of lower intensity, and therefore those parts of the signals are stable. The present invention is intended to use those parts to detect the position of the mark M.

Figure 4A:
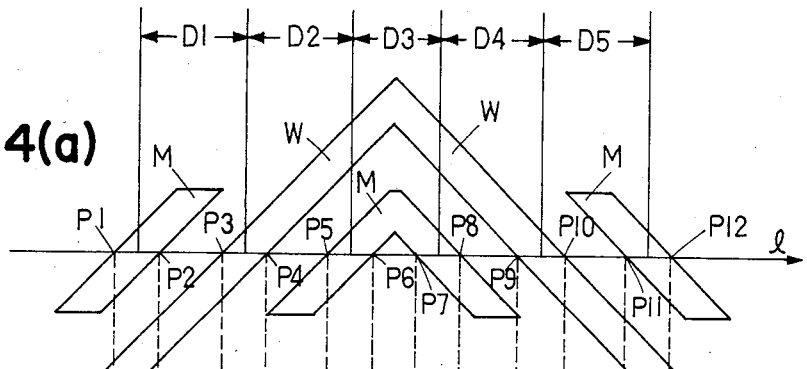
FIGS. 4(a-c) illustrate the signals obtained by the scanning method of FIG. 3.
Figure 4B:
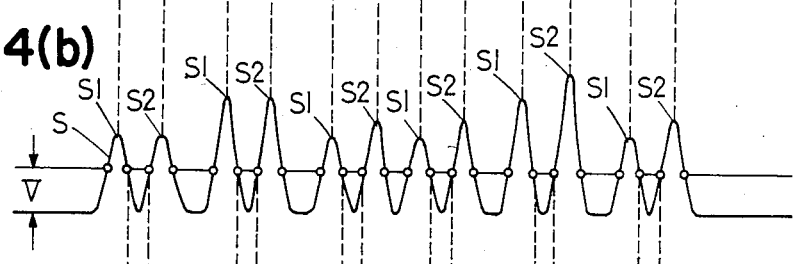

FIG. 4 shows a certain state of the alignment mark M on the mask 1 and the alignment mark W on the wafer 2, and the signals obtained therefrom. In FIG. 4(a), the marks M and W are scanned by the laser beam along the scanning line l in the direction shown by the arrow. The leading edges of the mark M, which are those edges of the bars of the respective marks which are scanned first, along the scanning line l are shown by reference numerals P1, P5, P7 and P11, the trailing edges of the mark M by the reference numerals P2, P6, P8 and P12; the leading edges of the wafer alignment mark W by the reference numerals P3 and P9, and the trailing edges thereof by the reference numerals P4 and P10. Those edges are shown as corresponding to the respective points on the signals shown in FIG. 4(b), as co-related by the broken lines. The distances between the centers of the marks M and W are designated by D1, D2, D3, D4 and D5 as shown in FIG. 4(a). The alignment between the mask 1 and wafer 2 is deemed to have been achieved when the distance D1 equals to the distance D2 (D1=D2), and the distance D4 equals to the distance D5 (D4=D5).

Figure 4C:
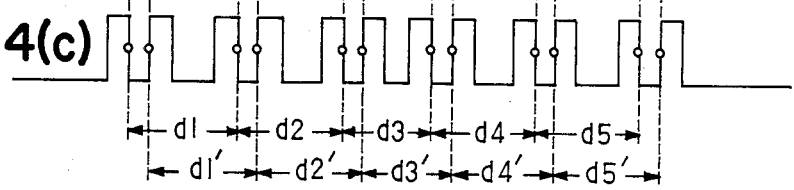

When the laser beam scans the marks M and W, the beam is reflected by the mask 1 and wafer 2 surfaces and by the marks thereon. The light reflected contains normal or specular reflection light by the mask 1 and/or wafer 2 surfaces, and the reflection light scatteredly reflected by the edges P1 to P12. Only the latter light is received by a photoelectric transducer which produces, in response to the respective edges P1 to P12, a signal S in the form shown in FIG. 4(b). Since the marks M and W each have the width D which is so large as to be 2 to 3 times the beam diameter, the light scattered at the leading and trailing edges P1, P2, P3, P4, P5, P6, P7, P8, P9, P10, P11 and P12 are sensed individually as shown in FIG. 4(b). The individual pulse signals are cut at a suitable threshold V as shown in FIG. 4(b) and reformed into a series of rectangular pulse signals as shown in FIG. 4(c), corresponding to the signals of FIG. 4(b).

As discussed hereinbefore with respect to FIG. 3, the falling part of the signal Sl and the rising part of the signal Sr do not vary so much. From this, it will be understood that the falling parts of the signals corresponding to the leading edges P1, P3, P5, P7, P9 and P11, and the rising parts of the signals corresponding to the trailing edges P2, P4, P6, P8, P10 and P12, are relatively more constant or more reliable. Therefore, those parts are used for the mark detection. From each of the mark elements scanned by the beam, a couple of signals, i.e., first and second signals S1 and S2 are provided in response to its leading and trailing edges. For the first signal, the point on its falling part at which it cut by the threshold is used for the position signal. On the other hand, for the second signal, the point on its rising part at which it is cut by the threshold is used for the position signal. Those points are shown in FIG. 4(c), as small circles. The center of those points is taken as the center of the mark element, that is, the bar of the mark. This applies to all of the mark elements scanned by the beams.

The distances between adjacent falling parts of the first signals marked by the small circles are shown as being d1, d2, d3, d4 and d5, and the distances between adjacent rising parts of the second signals marked by the small circles are shown as being d1', d2', d3', d4' and d5'. The distances D1, D2, D3, D4 and D5 between the adjacent mark element on the scanning line l are determined as follows:

$$D1 = (d1 + d1')/2$$

$$D2 = (d2 + d2')/2$$

$$D3 = (d3 + d3')/2$$

$$D4 = (d4 + d4')/2$$

$$D5 = (d5 + d5')/2$$

Thus, the each distance between the mask alignment mark M and the wafer alignment mark W is detected as the average of the distance between the falling parts of the leading edges and the distance between the rising parts of the trailing edges.

Figure 5:
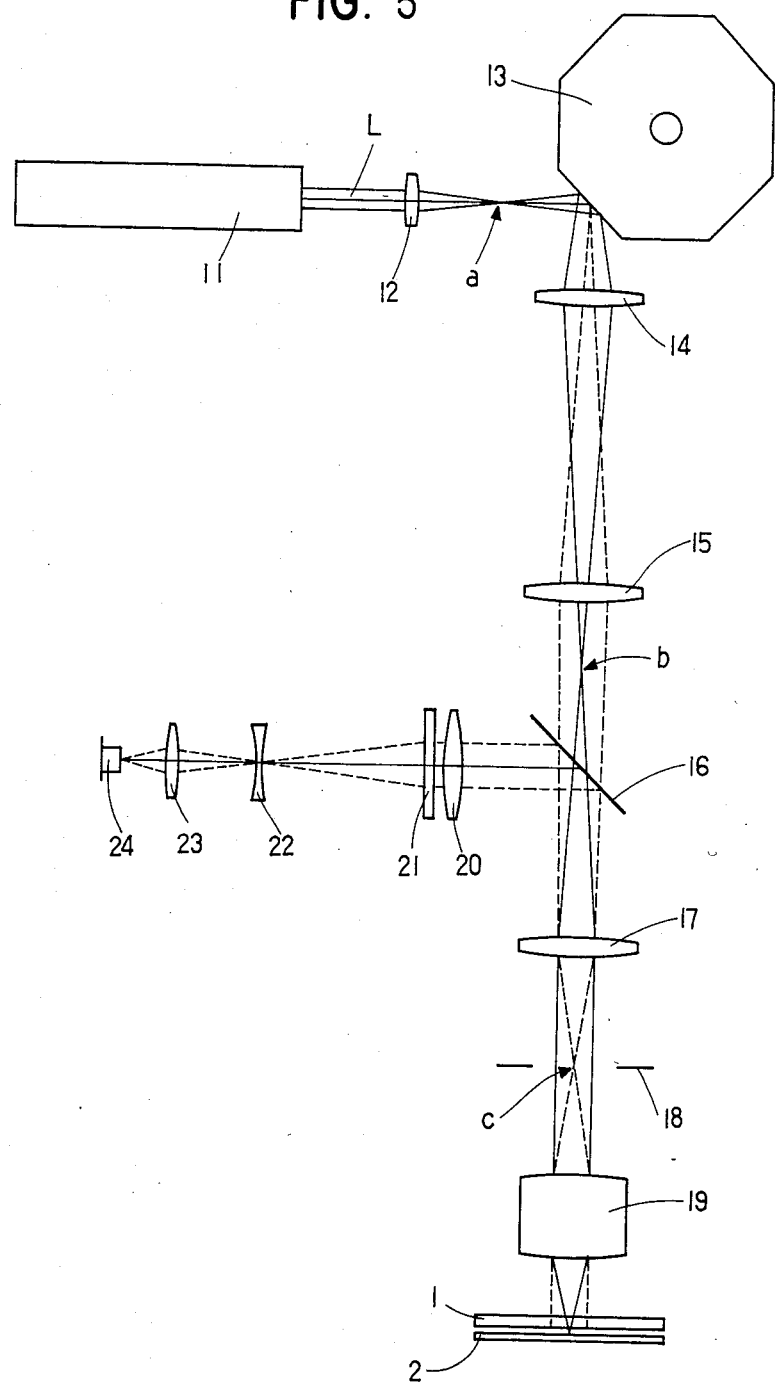
FIG. 5 shows an optical system for practicing the method illustrated in FIGS. 3 and 4.

FIG. 5 shows an optical system for detecting the position of the alignment marks M and W. Along the optical path of the laser beam L emitted by the laser beam generator 11, a condenser lens 12, and a polygonal mirror 13 which deflects the laser beam with its rotation, are provided. Along the optical path of the laser beam L deflected by the polygonal mirror 13, there are provided a relay lens 14, a field lens 15, a beam splitter 16 for allowing the deflected beam to pass through and directing the beam reflected by the mask 1 and/or wafer 2 toward a photoelectric transducer 24, a relay lens 17, an aperture stop 18 and objective lens 19 in the order named. Through those optical elements, the laser beam L is incident on the mask 1 and wafer 2. Along the path of the beam reflected thereby, after the beam splitter 16, there are provided an imaging lens 20, a wavelength selection filter 21, a partial shield 22, a condenser lens 23 and the photoelectric transducer 24.

In this optical system, the laser beam L generated by the laser source 11 is condensed by the condenser lens 12 to a point a, and then the beam L is incident on the deflector, that is, the polygonal mirror 13, which directs the beam substantially particularly and deflects the beam scanningly in the direction perpendicular to the optical path. The beam L then passes through the relay lens 14 and the field lens 15 to condense at a point b. Then, it passes through the beam splitter 16 and relay lens 17. The principal ray of the laser beam L passes the focal point c of the objective lens 19, which is located at the center of the aperture stop 18. Since the principal ray passes the focal point c, the principal ray of the laser beam L incident on the mask 1 and wafer 2 is parallel with the optical axis, so that the principal ray is perpendicular to the mask 1 and wafer 2 surfaces. The laser beam L is imaged as a fine spot by the objective lens 19 and scans the mask 1 and wafer 2 in accordance with the rotation of the polygonal mirror 13.

When the beam L is incident on a flat portion, i.e., not the edges of the marks, of the mask 1 and/or wafer 2, the reflected beam traces back the on-coming beam shown by the broken lines and passes the pupil at or adjacent the focal point c of the objective lens. The reflected beam then reaches the beam splitter 16 through the relay lens 17, tracing back the on-coming beam. When, on the other hand, the beam L is incident on a non-flat portion, that is, the edges P1, P2, P3 . . . P11 and P12 of the alignment marks M and W, the beam L is reflected and scattered by the edges so that the reflected beam does not trace back the route shown by the broken lines. That is, the reflected beam does not necessarily pass the center of the entrance pupil, i.e., the focal point c, but is passes the marginal area of the entrance pupil. Thus, the reflected light is spatially separated there into the reflected light that is not scattered and the reflected light that is scattered.

The light not scattered and reflected by the mirror surfaces of the mask 1 and wafer 2 passes through the relay lens 17, and it is separated by the beam splitter 16 to the light deflected substantially orthogonally toward the photoelectric transducer 24 and to the light passing therethrough toward the polygonal mirror. The relay lens 17 has a power for imaging the beam at a point b. Along the optical path toward the photoelectric transducer 24, there is provided a lens 20 so that the focal point b of the relay lens 17 and the partial blocking plate 22 are optically conjugate. Also provided is a filter 21 which allows the light for the detection by the photoelectric transducer 24 to pass, but prevents the light for an unshown observation optical system from passing. The non-scattered light beam deflected toward the photoelectric transducer 24, therefore, is focused at the central portion of the partial blocking plate 22, which is formed by a transparent glass plate with its central portion patterned by a light blocking metal or coloring material to block the light. Thus, the non-scattered beam is prevented from reaching the photoelectric transducer 24.

The scattered beam is not entirely focused at the central portion of the light blocking plate 22, so that it is allowed to reach the photoelectric transducer 24. Therefore, only when the laser beam L illuminates the edge portions of the marks M and W, the photoelectric transducer 24 produces the output signal.

Figure 6:
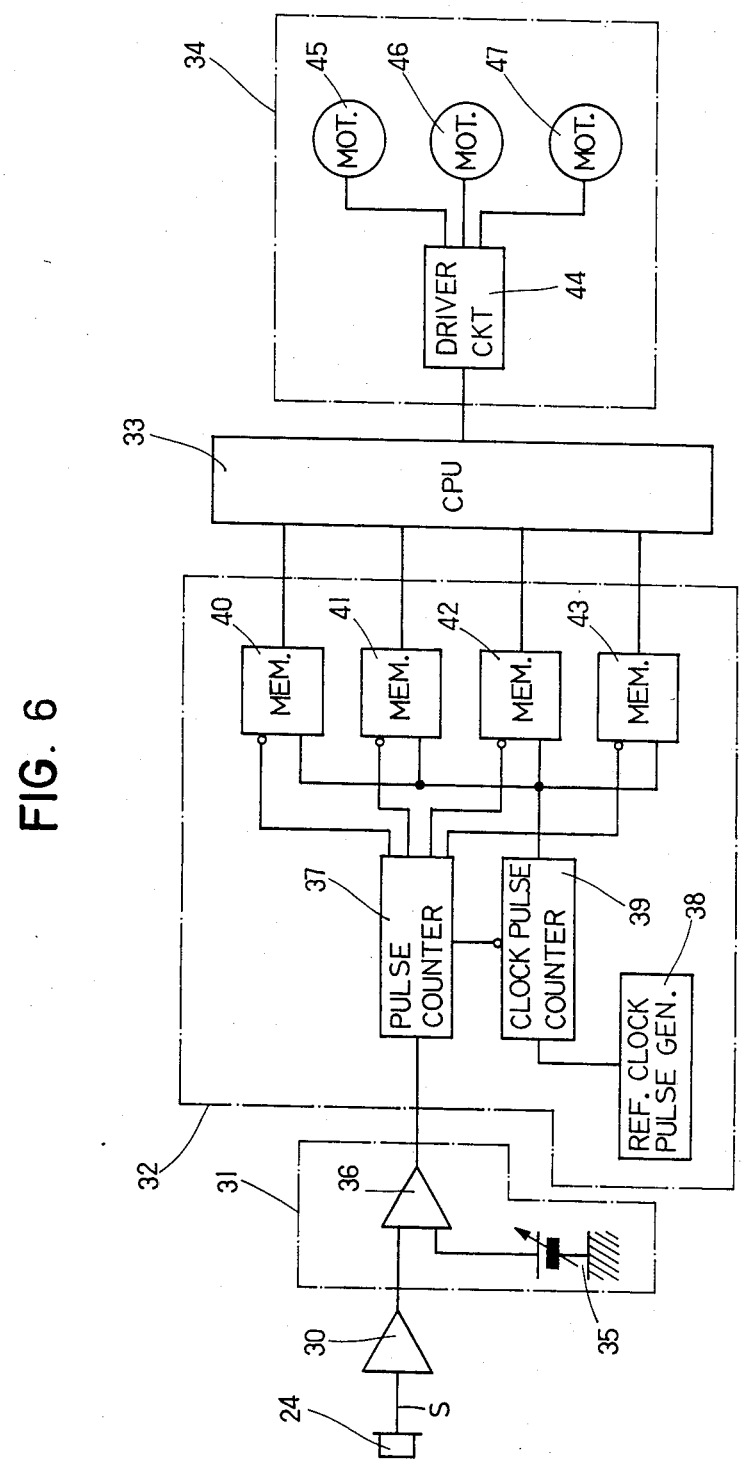
FIG. 6 shows a block diagram for the detection system of FIGS. 3, 4 and 5.

FIG. 6 shows a diagram of the control system for the above described apparatus. The control system receives the output of the photoelectric transducer 24 which is indicative of the degree of misalignment, and causes the aligning operation. The output of the photoelectric transducer 24 is introduced into the amplifier circuit 30, which is connected in series to a pulse converter circuit 31, a pulse interval measuring circuit 32, CPU 33 and driver circuit means 34. The pulse converter circuit 31 includes a threshold voltage generating circuit 35 and a comparator 36 connected to the amplifier circuit 30. The pulse interval generating circuit 32 includes a pulse counter circuit 37 to which the comparator 36 is connected, a reference clock generating circuit 38, a clock counter circuit 39 and parallel-connected clock count memorizing circuits 40, 41, 42 and 43 having latches. The driver circuit means 34 includes a driving circuit 44 to which the output of the CPU 33 is applied and pulse motors 45, 46 and 47 for moving an unshown wafer stage in X, Y and $\theta$ directions.

The output signal S of the photoelectric transducer 24, produced in response to the light scattered by the edges of the alignment marks M and W, is amplified by the amplifier circuit 30 to the form show in FIG. 4(b), and then introduced into the pulse converter circuit 31, which converts the signal to the rectangular pulse signals as shown in FIG. 4(c), by the comparator 36 and the reference voltage generating circuit 35, which cut the signal S at the predetermined level and provide the rectangular pulses with the width equal to the adjacent cut points. The resultant pulse signals are introduced into the pulse interval measuring circuit 32 to obtain, as a digital amount, the interval of the edges as described hereinbefore, and transmit it to the CPU 33, where the deviation between the mask 1 and wafer 2 is calculated, and transmitted to the driving circuit 44 of the driver circuit means 34, which actuates the pulse motors 45, 46 and 47 to move the wafer stage relative to the mask.

As described in the foregoing, according to the described embodiment of the present invention, the beam diameter is small while the mark width is relatively large, so that the edge signals are obtained separately, whereby the center of the mark width is obtained as the middle point between the falling part of the pulse from the mark leading edge and the rising part of the pulse from the mark trailing edge. Because of this, the accuracy of the mark position detection is improved. Particularly, when the present invention is used with the alignment and exposure apparatus for manufacturing integrated circuits, an expensive element, such as a phase plate, which requires high precision, is made unnecessary. Also, the present invention is applicable to the alignment of a print master.

While the invention has been described with reference to the structures disclosed herein, it is not confined to the details set forth and this application is intended to cover such modifications or changes as may come within the purpose of the improvements or the scope of the following claims.

What is claimed is:

1. A method of determining the relative position between bar-like marks, comprising:
    scanning the bar-like marks along a scanning line thereacross with a beam of light having a cross-sectional diameter which is smaller than the width of the bar-like marks measured along the scanning line;
    receiving, with photoelectric transducer means, light scattered by the leading edge of one of the marks and light scattered by the trailing edged of said one of the marks, and producing a first pulse signal having rising and falling portions corresponding to the leading edge of said one of the marks and a second pulse signal having rising and falling portions corresponding to the trailing edge of said one of the marks;
    receiving, with the photoelectric transducer means, light scattered by the leading edge of another of the marks and light scattered by a trailing edge of said other of the marks, and producing a third pulse signal having rising and falling portions corresponding to the leading edge of said other of the marks and a fourth pulse signal having rising and falling portions corresponding to the trailing edge of said other one of the marks; and determining the relative position between the one and the other of the marks in accordance with the falling portion of the first pulse signal, the rising portion of the second pulse signal, the falling portion of the third pulse signal and the rising portion of the fourth pulse signal.

2. A method according to claim 1 wherein said receiving and producing steps includes comparing the first, second, third, and fourth pulse signals with a predetermined threshold level.

3. An apparatus for determining the relative position between bar-like marks comprising:

means for scanning the bar-like marks along a scanning line thereacross with a beam of light having a cross-sectional diameter which is smaller than the width of the bar-like marks measured along the scanning line;

photoelectric transducer means for receiving light scattered by a leading edge of one of the marks, light scattered by a trailing edge of said one of the marks, and producing a first pulse signal having rising and falling portions corresponding to the leading edge of said one of the marks and a second pulse signal having rising and falling portions corresponding to the trailing edge of said one of the marks; said photoelectric transducer means further receiving light scattered by a leading edge of another of the marks, light scattered by a trailing edge of said other of the marks, and producing a third pulse signal having rising and falling portions corresponding to the leading edge of said other of the marks and a fourth pulse signal having rising and falling portions corresponding to the trailing edge of said other of the marks; and means responsive to said first, second, third, and fourth pulse signals for determining the relative position between the one mark and the other mark in accordance with the falling portion of the first pulse signal, the rising portion of the second pulse signal, the falling portion of the third pulse signal and the rising portion of the fourth pulse signal.

* * * * *

UNITED STATES PATENT AND TRADEMARK OFFICE
CERTIFICATE OF CORRECTION

PATENT NO. : 4,579,453

DATED : April 1, 1986

INVENTOR(S) : Yoshinori Makita

It is certified that error appears in the above-identified patent and that said Letters Patent is hereby corrected as shown below:

Column 2, line 5, change "illustrated" to --illustrates--.

Column 3, line 9, change "is" to --are--; and
line 12, change "ml of and mark M" to --ml of the mark M--.

Column 4, line 10, change "it cut" to --it is cut--; and
line 37, change "Thus, the each" to --Thus, each--.

Column 6, line 12, change "form show" to --form shown--; and
line 58, change "edged" to --edge--.

Column 7, line 13, change "includes" to --include--.

Signed and Sealed this

Sixth Day of January, 1987

*Attest:*

DONALD J. QUIGG

*Attesting Officer*   *Commissioner of Patents and Trademarks*